United States Patent [19]
Seyama et al.

[11] Patent Number: 5,166,867
[45] Date of Patent: Nov. 24, 1992

[54] BUS BAR FOR A CIRCUIT BOARD

[75] Inventors: Kiyotaka Seyama; Seiichi Saito; Chikayuki Kumagai, all of Kawasaki; Toshinari Hayashi, Tama, all of Japan

[73] Assignee: Fujitsu Limited, Kawasaki, Japan

[21] Appl. No.: 27,062

[22] Filed: Mar. 17, 1987

Related U.S. Application Data

[63] Continuation of Ser. No. 815,005, Dec. 31, 1985, abandoned.

[51] Int. Cl.$^5$ .............................................. H01R 9/00
[52] U.S. Cl. ................................ 361/407; 174/72 B
[58] Field of Search ................. 174/68 B, 70 B, 71 B, 174/72 B, 88 B, 99 B, 129 B; 361/407

[56] References Cited

U.S. PATENT DOCUMENTS

| | | | |
|---|---|---|---|
| 3,491,267 | 1/1970 | Goshorn | 361/407 |
| 3,778,735 | 12/1973 | Steenmetser | 174/72 B |
| 4,236,046 | 11/1980 | De Vries | 174/72 B |
| 4,241,381 | 12/1980 | Cobauge et al. | 361/407 X |
| 4,382,156 | 5/1983 | Jodoin | 174/72 B |
| 4,401,844 | 8/1983 | Fleuret | 174/72 B |
| 4,440,972 | 4/1984 | Taylor | 174/72 B |
| 4,451,694 | 5/1984 | Harper et al. | 174/72 B |
| 4,517,405 | 5/1985 | Masaki | 174/68 B |
| 4,517,406 | 5/1985 | Erdle | 174/72 B |
| 4,536,826 | 8/1985 | Ahiskali | 361/407 |
| 4,570,031 | 2/1986 | Inoue | 174/72 B |
| 4,584,768 | 4/1986 | Tosti | 174/72 B |
| 4,599,486 | 7/1986 | Herrandez | 174/72 B |
| 5,051,542 | 9/1991 | Hernandez | 361/398 |

FOREIGN PATENT DOCUMENTS

| | | | |
|---|---|---|---|
| 0131265 | 1/1985 | European Pat. Off. | 174/72 B |
| 1254724 | 11/1967 | Fed. Rep. of Germany | 174/72 B |
| 1465167 | 4/1971 | Fed. Rep. of Germany | 174/72 B |
| 2653350 | 6/1978 | Fed. Rep. of Germany | 174/72 B |
| 44-26780 | 11/1969 | Japan | 174/72 B |
| 0105320 | 6/1983 | Japan | 174/72 B |

OTHER PUBLICATIONS

Adams et al, High Current Laminar Bus, IBM Tech. Disc. Bull., vol. 22 #2 Jul. 1979, pp. 527 and 528, relied on.

Primary Examiner—Leo P. Picard
Assistant Examiner—D. Sparks
Attorney, Agent, or Firm—Staas & Halsey

[57] ABSTRACT

A massive bus bar for supplying a determined power voltage to a circuit component mounted on a rigid circuit board having a conductor layer connecting the component to a bus bar connecting pad formed on the surface of the board. Plurality of first notches extend through a main surface of the bus bar from a common longitudinal edge, perpendicularly to the longitudinal axis of the bus bar and throughout the full longitudinal extent of the bus bar, and define a plurality of posts which are secured at their bottom surfaces to the conductive pads on the circuit board surface. The first notches facilitate flexing of the bus bar and reduce stresses otherwise produced due to the rigid connection of the bus bar to the circuit board, while not significantly diminishing the current handling capability of the bus bar. Second and third pluralities of orthogonally extending notches, respectively parallel and perpendicular to the longitudinal axis of the bus bar, are formed in the bottom surfaces of each post, further reducing stresses.

18 Claims, 2 Drawing Sheets

BUS BAR FOR A CIRCUIT BOARD

This is a continuation of co-pending application Ser. No. 815,005 filed on Dec. 31, 1985 now abandoned.

BACKGROUND OF THE INVENTION

The present invention relates to a bus bar for supplying a predetermined power voltage to a circuit board, particularly to a structure allowing to the direct securing of a relatively thick and long bus bar to a circuit board.

A circuit board package in certain electronic equipment, such as middle- or large-scale computers, for instance, requires a supply of a large current of a predetermined voltage. The current sometimes amounts to a few or several hundred amperes. A bus is provided to constitute a power supply line for components such as ICs of an electronic circuitry formed on the circuit board. Generally, the larger the size of a circuit board, the greater the current to be supplied to the circuit board. Further, a large-sized circuit board needs a long bus. Accordingly, a bus to be associated with a large-sized circuit board is required to have a large cross-sectional area; for example, a cross-sectional area of 100 to 200 mm$^2$ is necessary for a bus supplying a circuit board having a side length of 50 cm with a current as mentioned above. Such a bus usually has a bar-like structure and is referred to as a bus bar.

There are various disclosures relating to buses for supplying power voltages, including those classified into two categories: 1) a relatively thin bus formed from a conductor plate (Tokukaisho 54-68972 and Tokukaisho 55-18493), the conductor plate being directly secured to a corresponding circuit board by using screws or soldered to the pins of a connector mounted on the board; 2) a relatively thick bus having a bar structure, which is usually mounted on a mother-board (or backboard) and is provided with a connection to a corresponding circuit board package through a specially designed connector (Tokukaisho 59-44910).

As is evident from these disclosures, a relatively thin bus, which is associated with a relatively small-sized circuit board requiring a supply of a relatively small current, can be secured to the circuit board by soldering or by screws. On the other hand, for a relatively large-sized circuit board requiring a supply of a relatively large current and unassociated relatively thick bus, it is difficult to attain a uniform solder joint between the bus and the board because of the circuit inherent warping thereof. In the securing of a large-sized circuit board by means of screws, stresses are produced in the circuit board because the inherently warped circuit board is forced so as to come in close contact with the bus bar. These stresses often cause a defects, such as cracks, in the circuit board or the electronic components mounted thereon.

A relatively thick bus, i.e. bus bar, which is secured to a circuit board is disclosed in Tokukaisho 59-104192. This bus bar is intended to reform the inherent warp of a circuit board, reduce the impedance of a power supplying pattern formed on the board, and supply a power voltage therethrough to the circuit on the board. The disclosed bus bar is supported by conductor pins secured to the circuit board.

A circuit board is usually subjected to heat cycles from room temperature to around 100° C. or higher due to the heat dissipation caused by a large current as mentioned before, which is supplied for the operation of the circuit board package. Accordingly, the circuit board is subject to additional stresses caused by the differential thermal expansion between the bus and the circuit board during the heat cycles. These stresses enhance the danger of the formation of defects in the circuit board or the components mounted thereon. Defects due to the differential thermal expansion are complicated by the materials of the bus bar and the circuit board, and by the temperature distribution on the board. Thermal stresses impose a more serious problem for circuit boards composed of a ceramic, e.g., alumina, because of the greater difference between the thermal expansion of alumina and that of copper which is usually used for a bus bar, and also because of the low flexibility of alumina.

The prior art conductor pins for securing a thick bus bar to a circuit board are effective for absorbing the stress exerted on the circuit board; however, it is undesirable, from the view points of process simplicity and manufacturing cost, to incorporate such conductor pins. Further, it is advantageous, for the uniform supply of a power voltage of a large current throughout a circuit board, to secure a bus bar so that it is in direct contact with a power supplying pattern on a circuit board. Therefore, it is desirable to provide a bus bar having a structure which allows the bus bar to be directly secured to a circuit board and which prevents the bus bar from producing defects in the circuit board or the electronic components mounted on the board.

SUMMARY OF THE INVENTION

It is, therefore, an object of the present invention to provide a bus bar having a relatively large thickness, which can be directly secured to a circuit board without producing defects in the circuit board or components mounted thereon.

It is another object of the present invention to provide a bus bar, having a relatively large thickness, which can be directly secured to a ceramic circuit board.

It is a further object of the present invention to provide a bus bar, having a relatively large thickness, with a structure which allows the bus bar to be directly secured to a circuit board simply and cost-effectively.

These and other objects of the present invention are attained by providing a bus bar comprising a plurality of cutout portions formed on a main surface thereof. Each of the cutout portions extends substantially perpendicularly to the longitudinal axis of the bus bar along the full extent, or length, of the surface. A plurality of posts defined by the cutout portions of the bus bar directly contact a conductor layer pattern for supplying a predetermined power voltage to a circuit formed on a circuit board. The bus bar further comprises a first plurality of notches formed on the bottom surface of each of the post, each of the notches extending substantially perpendicularly to longitudinal axis of the bus bar the full length of the surface. The bus bar further comprises a second plurality of notches extending substantially in parallel to the longitudinal axis of the bus bar the full length of the surface.

BRIEF DESCRIPTION OF DRAWINGS

The foregoing other objects and aspects of the present invention will become apparent from the following detailed description of embodiments of the invention, taken with reference to the accompanying drawings in which.

DESCRIPTION OF THE PREFERRED EMBODIMENTS

Figure 1:
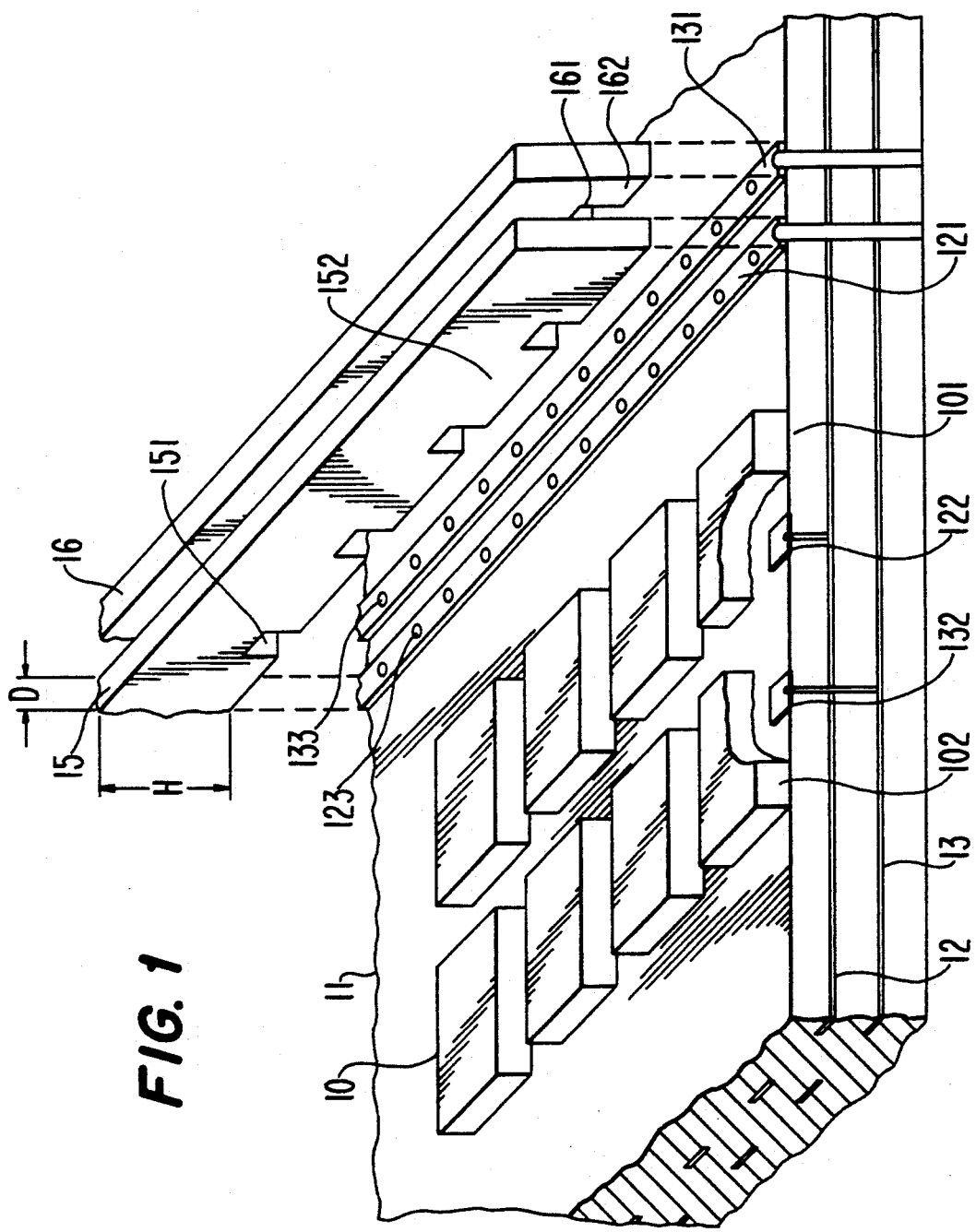
FIG. 1 is a partially cutaway and partially exploded perspective view showing bus bars and an associated circuit board having IC packages mounted thereon.

FIG. 1 is a partially cutaway and exploded perspective view of bus bars and an associated circuits board having integrated circuit (IC) mounted thereon. Referring to FIG. 1, IC packages 10 are mounted on a multilayered circuit board 11 having internal wiring pattern layers 12 and 13 for distributing respective predetermined power to the IC packages 10. The pattern layers 12 and 13 are respectively connected to terminal patterns 121 and 131 formed on the surface of the circuit board 11. Thus, power voltages of different levels are supplied to IC packages 101 and 102 via respective terminal lands, or pads, 122 and 132.

The terminal patterns 121 and 131 are further connected to respective other portions of the same internal pattern layers 12 and 13 via respective pluralities of through-holes 123 and 133. Each of the terminal patterns 121 and 131 is formed from a thin copper layer of a thickness of 50 microns, for instance, and, therefore, has too large a resistance to be used as a bus for supplying a power voltage of a large current as mentioned before. Although shown to be separated from the circuit board 11 in FIG. 1, bus bars 15 and 16, each having a thickness, or depth, dimension D of 7 mm and a height (H) of 30 mm of its main face, for instance, are secured to the circuit board 11 so as to make electrical contacts to the terminal patterns 121 and 131, respectively. Thus, all portions of the internal patterns 12 and 13 can be uniformly supplied with respective, uniform predetermined power voltages, even if a large current of several hundred amperes flows through each of the bus bars 15 and 16. The bus bars 15 and 16 may be laminated with an intervening insulating layer (not shown) therebetween.

According to the present invention, bus bars 15 and 16, each having a substantially rectangular cross-section are provided with respective pluralities of cutout portions or first notches 151 and 161 at the edge surface which is to be in contact with the corresponding terminal patterns 121 and 131. Each of the cutout portions 151 and 161 extends substantially perpendicularly to the longitudinal axis of the respective bus bar through the entire thickness or depth D. Thus, a plurality of posts 152 and 162 are defined by the cutout portions 151 and 161. The posts contact the terminal patterns 121 and 131.

Figure 2:
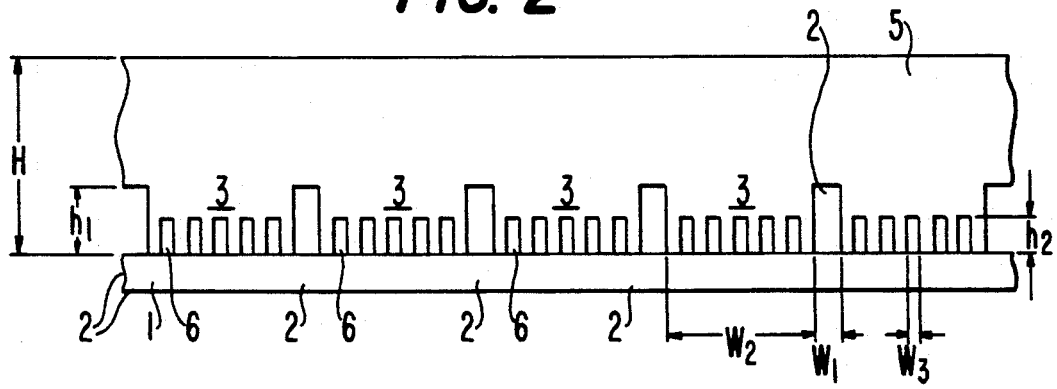
FIGS. 2 and 3 are fragmentary, side elevational and perspective views, respectively, of a bus bar, respectively, in accordance with the present invention.
Figure 3:
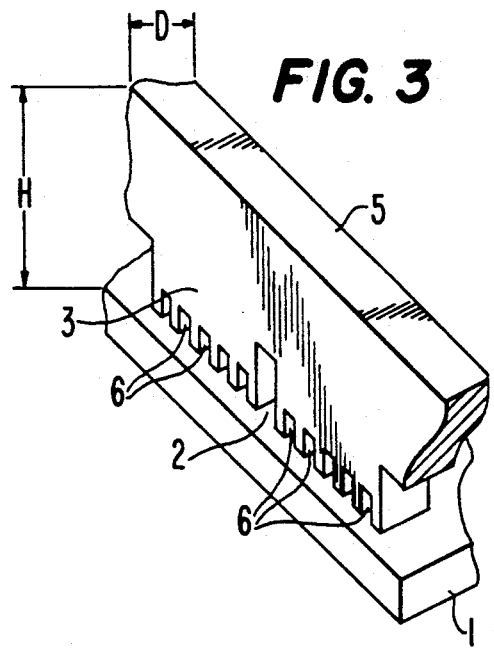

FIGS. 2 and 3 are fragmentary, side elevational and perspective views, respectively of a bus bar in accordance with a further feature of the present invention. The bus bar 5 shown in FIGS. 2 and 3 has plural cutout portions 2 and, hence, plural posts 3. Bus bar 5 may be secured to a circuit board 1 by using screws (not shown) or soldering to the aforesaid terminal pattern (not shown). Each of the cutout portions 2 extends substantially perpendicularly to the longitudinal axis of the bus bar 5 through the entire thickness, or depth, D, and along the entire longitudinal length of the bus bar, as shown in FIG. 3. Exemplary dimensions of each cutout portion and post include the respective widths (w1 and w2) of 2 mm and 20 mm and the height (h1) of 10 mm for the bus bar 5 having a height (H) of 30 mm and thickness (D) of 6 mm.

Since the bending stress of a body like the bus bar 5 is proportional to the solid, or continuous, height dimension (i.e. H−h1) to the third power, the bus bar 5, as shown in FIGS. 2 and 3, is rendered capable of bending in response to the warp of the circuit board 1 and also to the differential thermal expansion between the bus bar 5 and circuit board 1, due to the provision of cutout portions 2. The posts 3 help to ease the strain caused by the difference in the thermal expansion coefficients of the circuit board 1 and bus bar 5 by their height h1.

As shown in FIGS. 2 and 3, a plurality of second notches 6 are provided on the exposed, bottom or end surfaces of the posts 3. Each of the notches 6 extends substantially perpendicularly to the longitudinal axis of the bus bar 5 through the entire thickness or depth D thereof. The notches 6 are formed to have a height (h2) of 5 mm and a width (w3) of 0.5 mm and arranged with a pitch of 1 mm, for example. The notches 6 further ease the strain due to the differential thermal expansion of the circuit board 1 and bus bar 5.

Figure 4:
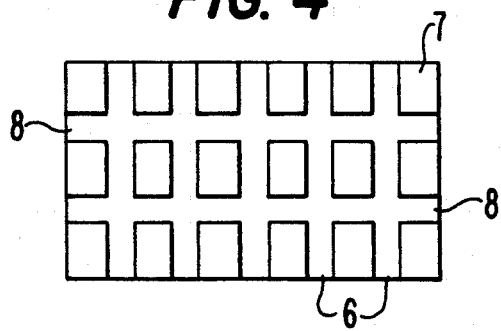
FIG. 4 is a plan view illustrating additional, first and second pluralities of notches formed on the end surface of each post as shown in FIGS. 2 and 3.

FIG. 4 is a plane view illustrating additional third notches 8 formed on the bottom surface 7 of each of the posts 3 shown in FIGS. 2 and 3. Each of the additional notches 8 extends parallel to the longitudinal axis of the bus 5 and thus substantially perpendicularly to the notches 6 and has the same height, h2, as the notches 6. The additional notches 8 help to ease the strain in the direction transverse to the orientation of the longitudinal axis of the bus 5 on the circuit board 1.

Each of the bus bars in accordance with the above described embodiments is secured to a circuit board through the posts; wherein the securing means may be screws or solder. When the bottom surface 7 of each post 3 is soldered to the aforesaid terminal pattern 121 or 131 on a circuit board 11 shown in FIG. 1, it is unnecessary to prevent solder from penetrating in the notches 6 and 8, because solder which is composed of a lead-tin solid solution, is elastic enough to ease the partial strain at each notch.

It is to be understood that the form of the present invention herein shown and described is to be taken as a preferred example of the same and that various changes in the shape, size and arrangement of parts may be restored to without departing from the spirit of the invention or the scope of the subjoined claims. Also it is to be understood that the phraseology or terminology employed herein is for the purpose of description and not of limitation.

We claim:
1. A bus bar comprising:
an elongated bar of metallic, conductive material defining a longitudinal axis and having a generally rectangular cross-section in a plane perpendicular to the longitudinal axis and parallel, major rectangular surfaces of common, predetermined length and height dimensions respectively parallel to and transverse to the longitudinal axis and parallel minor surfaces extending between the major surfaces and corresponding to the thickness dimension of the bar, one of said minor surfaces comprising a longitudinal mounting edge of the elongated bar; and said longitudinal mounting edge and adjacent portions of said parallel major rectangular surfaces of said bar comprising a plurality of posts defined by a corresponding plurality of first notches extending through the full thickness of the bar, transversely from the longitudinal mounting edge thereof to no greater than one-third the height dimension of the bar, said posts and first notches having respective, relative width dimensions in a direction parallel to the longitudinal axis of no greater than 10 to 1, and a plurality of second notches in the mounting edge surfaces of said posts, extending transversely to the longitudinal axis and of a height no greater than one-half the height of said posts.

2. A bus bar comprising:

an elongated bar of metallic, conductive material defining a longitudinal axis and having a generally rectangular cross-section in a plane perpendicular to the longitudinal axis and parallel, major rectangular surfaces of common, predetermined length and height dimensions respectively parallel to and transverse to the longitudinal axis and parallel minor surfaces extending between the major surfaces and corresponding to the thickness dimension of the bar, one of said minor surfaces comprising a longitudinal mounting edge of the elongated bar; and said longitudinal mounting edge and adjacent portions of said parallel major rectangular surfaces of said bar comprising a plurality of posts defined by a corresponding plurality of first notches extending through the full thickness of the bar, transversely from the longitudinal mounting edge thereof to no greater than one-third the height dimension of the bar, said posts and first notches having respective, relative width dimensions in a direction parallel to the longitudinal axis of no greater than 10 to 1; and a plurality of third notches in said longitudinal mounting edge surfaces of said posts, extending in a direction parallel to the longitudinal axis and of a height no greater than one-half the height of said posts.

3. A bus bar as recited in claim 1, wherein said plurality of said first notches extend to one-third the height dimension of the bar.

4. A bus bar as recited in claim 3 wherein said plurality of second notches extend to a height one-half the height of said posts.

5. A bus bar as recited in claim 3, further comprising:

a plurality of third notches in said longitudinal mounting edge surfaces of said posts, extending in a direction parallel to the longitudinal axis and of a height one-half the height of said posts.

6. A bus bar as recited in claim 3, further comprising:

a plurality of second notches in the mounting edge surface of said posts extending transversely to the longitudinal axis and of a height no greater than one-half the height of said posts; and a plurality of third notches in said longitudinal mounting edge surfaces of said posts, extending in a direction parallel to the longitudinal axis and thus transverse to the direction of said plurality of second notches and intersecting same, and of a height no greater than one-half the height of said posts.

7. A bus bar as recited in claim 6, wherein:

said first-notches extend to one-third the height dimension of the bar; and each of said second and third pluralities of notches is of a height approximately one-half the height of said posts.

8. In combination:

a circuit board having a planar mounting surface; an elongated terminal pad on the planar mounting surface of said circuit board; and an elongated bus bar of metallic, conductive material defining a longitudinal axis having a generally rectangular cross-section in a plane perpendicular to the longitudinal axis and parallel, major rectangular surfaces of common, predetermined length and height dimensions respectively parallel to and transverse to the longitudinal axis and parallel minor surfaces extending between the major surfaces and corresponding to the thickness dimension of the bar, one of said minor surfaces comprising a longitudinal mounting edge of the elongated bar;

said longitudinal mounting edge and adjacent portions of said parallel major rectangular surfaces of said bar comprising a plurality of posts defined by a corresponding plurality of first notches extending through the full thickness of the bar, transversely from the longitudinal mounting edge thereof to no greater than one-third the height dimension of the bar, said posts and first notches having respective, relative width dimensions in a direction parallel to the longitudinal axis of no greater than 10 to 1;

means for securing the longitudinal mounting edge surfaces of said posts to the elongated terminal pad of the circuit board, said securing means comprising soldered connections between the longitudinal mounting edge surfaces of said posts and said elongated terminal pads;

a plurality of second notches in said longitudinal mounting edge surfaces of said posts extending transversely to the longitudinal axis and of a height no greater than one-half the height of said posts; and a plurality of third notches in said longitudinal edge mounting surfaces of said posts, extending in a direction parallel to the longitudinal axis and thus transverse to the direction of said plurality of second notches and intersecting same, and of a height no greater than one-half the height of said posts.

9. The combination of claim 8, wherein:

said securing means comprises soldered connections received partially within said second and third pluralities of notches and between the longitudinally mounting edge surfaces of said posts and said elongated terminal pad.

10. A method of forming a bus bar comprising:

providing an elongated bar of metallic, conductive material defining a longitudinal axis having a generally rectangular cross-section in a plane perpendicular to the longitudinal axis and parallel, major rectangular surfaces of common, predetermined length and height dimensions respectively parallel to and transverse to the longitudinal axis and parallel minor surfaces extending between the major surfaces and corresponding to the thickness dimension of the bar;

defining a longitudinal edge surface of the elongated bar as the longitudinal mounting edge of the bar; and forming a plurality of first notches extending through the thickness dimension of the bar transversely to the longitudinal axis and from the longitudinal mounting edge surface thereof to no greater than one-third the height dimension of the bar at longitudinally spaced positions so as to define corresponding posts, said posts and first notches having respective relative width dimensions in a direction parallel to the longitudinal axis of 10 to 1.

11. The method of claim 10, further comprising:
forming a plurality of second notches in the longitudinal mounting edge surfaces of said posts extending transversely to the longitudinal axis and of a height no greater than one-half the height of said posts.

12. A method as recited in claim 10, further comprising:
forming a plurality of third notches in said longitudinal mounting edge surfaces of said posts, extending in a direction parallel to the longitudinal axis and of a height no greater than one-half the height of said posts.

13. A method as recited in claim 10, further comprising:
forming a plurality of second notches in the longitudinal mounting edge surfaces of said posts extending transversely to the longitudinal axis and of a height no greater than one-half the height of said posts; and
forming a plurality of third notches in said longitudinal mounting surfaces of said posts, extending in a direction parallel to the longitudinal axis and of a height no greater than one-half the height of said posts.

14. A method of forming an improved bus bar of a given metallic conductive material and having a longitudinal axis and a generally rectangular cross-section, defined by the height and thickness dimensions of the bus bar, in a plane perpendicular to the longitudinal axis, the improved bus bar having, selectively, an increased value of maximum current carrying capacity and/or a reduced value of rigidity in a plane including the longitudinal axis and parallel to the height dimension of the bus bar, relative to a bus bar of the given, metallic conductive material having nominal said height and thickness dimensions and a correspondingly defined, nominal cross-sectional area determining maximum current carrying capacity and rigidity values thereof, one of the longitudinally extending edges corresponding to the thickness dimension of each of said improved bus bar and the bus bar of said nominal dimensions comprising a longitudinal mounting edge surface of the corresponding bus bar, comprising:
selecting an elongated bar of the given, metallic conductive material, having an increased cross-sectional area relative to the nominal cross-sectional area; and
forming a plurality of first notches extending through the full thickness dimension of the elongated bar, transversely from the longitudinal mounting edge surfaces thereof at longitudinally spaced positions so as to define corresponding posts, said posts and first notches having respective, relative width dimensions in a direction parallel to the longitudinal axis of no greater than 10 to 1 and the first notches extending in the direction of the height dimension of the bar by an amount sufficient to reduce the rigidity value of the elongated bar to a value no greater than the rigidity value of a bus bar of the nominal cross-sectional area.

15. The method of claim 14, further comprising:
forming a plurality of second notches in the longitudinal mounting edge surfaces of said posts extending transversely to the longitudinal axis and of a height no greater than one-half the height of said posts.

16. A method as recited in claim 14, further comprising:
forming a plurality of third notches in said longitudinal mounting edge surfaces of said posts, extending in a direction parallel to the longitudinal axis and of a height no greater than one-half the height of said posts.

17. A method as recited in claim 14, further comprising:
forming a plurality of second notches in the longitudinal mounting edge surfaces of said posts extending transversely to the longitudinal axis and of a height no greater than one-half the height of said posts; and
forming a plurality of third notches in said longitudinal mounting edge surfaces of said posts, extending in a direction parallel to the longitudinal axis and of a height no greater than one-half the height of said posts.

18. A method of forming an improved bus bar of a given, metallic conductive material and having a longitudinal axis and a generally rectangular cross-section, defined by the height and thickness dimensions of the bus bar, in a plane perpendicular to the longitudinal axis, the improved bus bar having, selectively, an increased value of maximum current carrying capacity and/or a reduced value of rigidity in a plane including the longitudinal axis and parallel to the height dimension of the bus bar, relative to a bus bar of the given, metallic conductive material having nominal said height and thickness dimensions and a correspondingly defined, nominal cross-sectional area determining a maximum current carrying capacity and rigidity values thereof, one of the longitudinally extending edges corresponding to the thickness dimension of each of said improved bus bar and the bus bar of said nominal dimensions comprising a longitudinal mounting edge surface of the corresponding bus bar, comprising:
selecting an elongated bar of the given, metallic conductive material and having an increased cross-sectional area relative to the nominal cross-sectional area; and
forming a plurality of notches extending through the full thickness dimension of the elongated bar, transversely from the longitudinal mounting edge surface thereof to a height ($h_1$) relative to the height dimension (H) of the bar, wherein ($h_1$) is not greater than one-third (H) and, for a given thickness dimension (D) of the elongated bar, is selected in accordance with reducing the rigidity of the bar in a plane parallel to the major surfaces of the bar in proportion to the factor $(H-h_1)^3$ while maintaining a required maximum value of current carrying capacity determined in accordance with the proportional relationship $(H-h_1) \times D$.

* * * * *

UNITED STATES PATENT AND TRADEMARK OFFICE
CERTIFICATE OF CORRECTION

PATENT NO.   :   5,166,867

DATED        :   November 24, 1992

INVENTOR(S)  :   KIYOTAKA SEYAMA, SEIICHI SAITO, CHIKAYUKI KUMAGAI and TOSHINARI HAYASHI It is certified that error appears in the above-identified patent and that said Letters Patent is hereby corrected as shown below:

Column 1, line 7, after "allowing" delete "to";

line 48, "unassociated" should be --an associated,--;

line 50, before "board" insert --circuit--, delete "circuit";

line 55, after "cause" delete "a";

Column 2, line 33, after "bar" insert a comma --,--;

line 56, "post" should be --posts--;

line 64, after "foregoing" insert --and--.

Column 3, lines 5 and 6, delete "respectively,";

UNITED STATES PATENT AND TRADEMARK OFFICE
CERTIFICATE OF CORRECTION

PATENT NO. : 5,166,867

DATED : November 24, 1992

INVENTOR(S) : Kiyotaka Seyama, Seiichi Saito, Chikayuki Kumagai and Toshinari Hayashi It is certified that error appears in the above-indentified patent and that said Letters Patent is hereby corrected as shown below:

Column 3, line 14, "circuits" should be --circuit-- line 15, "circuit" should be --circuits--

Signed and Sealed this

Sixteenth Day of November, 1993

*Attest:*

BRUCE LEHMAN

*Attesting Officer*  Commissioner of Patents and Trademarks